(12) United States Patent
Liu

(10) Patent No.: US 12,740,013 B2
(45) Date of Patent: Sep. 15, 2026

(54) IMMERSION COOLING SYSTEM

(71) Applicant: AEWIN TECHNOLOGIES CO., LTD., New Taipei City (TW)

(72) Inventor: Cheng-En Liu, New Taipei City (TW)

(73) Assignee: AEWIN TECHNOLOGIES CO., LTD., New Taipei City (TW)

( * ) Notice: Subject to any disclaimer, the term of this patent is extended or adjusted under 35 U.S.C. 154(b) by 260 days.

(21) Appl. No.: 18/244,963

(22) Filed: Sep. 12, 2023

(65) Prior Publication Data

US 2025/0040085 A1 Jan. 30, 2025

(30) Foreign Application Priority Data

Jul. 27, 2023 (TW) ................................ 112128176

(51) Int. Cl.
*H05K 7/20* (2006.01)

(52) U.S. Cl.
CPC ......... *H05K 7/203* (2013.01); *H05K 7/20318* (2013.01); *H05K 7/20818* (2013.01)

(58) Field of Classification Search
CPC . H05K 7/203; H05K 7/20318; H05K 7/20818
See application file for complete search history.

(56) References Cited

U.S. PATENT DOCUMENTS 10,966,349 B1 * 3/2021 Lau ........................... G01F 1/74
2017/0325355 A1 * 11/2017 Lau .................... H05K 7/20381
2019/0166725 A1 * 5/2019 Jing ................... H05K 7/20327
2021/0307210 A1 * 9/2021 Wong ................. H05K 7/20327
2021/0410320 A1 * 12/2021 Yang .................. H05K 7/20327
2022/0264761 A1 * 8/2022 Keehn .................... H05K 7/203

* cited by examiner

*Primary Examiner* — Eric S Ruppert
*Assistant Examiner* — Hans R Weiland
(74) *Attorney, Agent, or Firm* — RANKIN, HILL & CLARK LLP

(57) ABSTRACT

An immersion cooling system is provided and includes: a box body having a first accommodating space and a second accommodating space, where the first accommodating space accommodates a heat dissipation medium and at least one heating unit; a condensing unit arranged in the second accommodating space; and at least one valve unit disposed in the box body and corresponding to the second accommodating space and the condensing unit. The gasified heat dissipation medium flows and impacts the condensing unit to blow off the liquefied heat dissipation medium attached onto the condensing unit when the valve unit is opened.

11 Claims, 4 Drawing Sheets

IMMERSION COOLING SYSTEM

CROSS-REFERENCE TO RELATED APPLICATIONS

This application claims priority to Taiwan Application Serial No. 112128176, filed on Jul. 27, 2023. The entirety of the above-mentioned patent application is hereby incorporated by reference herein and made a part of this specification.

BACKGROUND

1. Technical Field

The present disclosure relates to a cooling system, and more particularly, to an immersion cooling system that uses a gas exhaust pressure mechanism to increase heat exchange efficiency.

2. Description of Related Art

The two-phase immersion cooling method utilizes the phase conversion between the gas state and the liquid state of the water-cooling liquid to take away heat. For example, the water-cooling liquid in the sealed tank absorbs the heat energy generated by the heating element and gasifies, then the gasified water-cooling liquid condenses on a condenser after contacting the condenser, and droplets of the water-cooling liquid condensed on the condenser fall back into the water-cooling liquid by gravity, thereby achieving the heat dissipation effect of the heating element via this circulation.

However, the existing two-phase immersion cooling method still has the problem that the droplets of the water-cooling liquid adhere to the surface of the condenser and cannot fall by gravity, which will lead to low heat exchange efficiency of the condenser, or even failure.

For the aforementioned problem, the existing solution is to increase the pump speed to increase the efficiency of cold water entering the condenser, or to increase the fan speed to increase the heat dissipation efficiency of hot water in the condenser. However, this method will increase energy consumption, and it will not help to solve the problem that the droplets of the water-cooling liquid are still attached to the surface of the condenser. In addition, when the equipment is shut down and the cover is opened, the remaining water-cooling liquid vapor will escape, causing the water-cooling liquid to be replenished and increasing costs.

SUMMARY

The present disclosure provides an immersion cooling system, which comprises: a box body having a first accommodating space and a second accommodating space arranged along a first direction, wherein the first accommodating space accommodates a heat dissipation medium and at least one heating unit immersed in the heat dissipation medium, wherein the heat dissipation medium is gasified after absorbing a heat energy of the heating unit, and the gasified heat dissipation medium moves from the first accommodating space to the second accommodating space; a condensing unit arranged in the second accommodating space along the first direction and a second direction perpendicular to the first direction, wherein the condensing unit is used to enable the gasified heat dissipation medium to undergo heat exchange, condensation and liquefaction; and at least one valve unit disposed on the box body along the second direction and corresponding to the second accommodating space and the condensing unit, wherein the gasified heat dissipation medium flows and impacts the condensing unit to blow off the liquefied heat dissipation medium attached onto the condensing unit when the valve unit is opened.

In the aforementioned immersion cooling system, the valve unit is opened when an internal pressure of the box body rises above 1 atmosphere.

In the aforementioned immersion cooling system, the condensing unit is defined with an upper half portion and a lower half portion in the first direction, and the valve unit corresponds to the upper half portion.

In the aforementioned immersion cooling system, a quantity of the valve units is plural, the condensing unit is defined with a plurality of intervals in the second direction, and a quantity of the plurality of intervals corresponds to the quantity of the plurality of valve units.

In the aforementioned immersion cooling system, the plurality of valve units are respectively located at midpoints of the plurality of intervals in the second direction.

In the aforementioned immersion cooling system, a distance between the valve unit and a bottom side of the condensing unit is ⅔ of a total length of the condensing unit in the first direction.

In the aforementioned immersion cooling system, a total opening area of the valve unit is ⅙ of a total cross-sectional area formed by the condensing unit in the first direction and the second direction.

In the aforementioned immersion cooling system, the first direction is a direction of gravity.

In the aforementioned immersion cooling system, the condensing unit is a U-shaped condenser, a straight condenser, or a serpentine condenser.

In the aforementioned immersion cooling system, the present disclosure further comprises a recovery unit, wherein the recovery unit has a water outlet pipeline, a tank body, a pump and a water inlet pipeline, wherein the water outlet pipeline is in communication with the tank body and the valve unit, the water inlet pipeline is in communication with the tank body and the first accommodating space, and the pump is arranged in the water inlet pipeline, wherein when the valve unit is opened, the gasified heat dissipation medium enters the water outlet pipeline via the valve unit, and then enters the tank body to be condensed, wherein the condensed heat dissipation medium is driven by the pump and enters the first accommodating space via the water inlet pipeline.

In the aforementioned immersion cooling system, the present disclosure further comprises a monitoring unit for controlling the valve unit to open or close according to one or more of a plurality of sensing parameters obtained by the monitoring unit.

In the aforementioned immersion cooling system, the plurality of sensing parameters include an inlet water temperature of the condensing unit, an outlet water temperature of the condensing unit, an inlet water flow rate of the condensing unit, an outlet water flow rate of the condensing unit, a fan speed of the condensing unit, a temperature of the heat dissipation medium in the box body, a temperature of the gasified heat dissipation medium in the box body, a pressure of the gasified heat dissipation medium in the box body and a temperature of the heating unit.

To sum up, the immersion cooling system of the present disclosure utilizes the gas exhaust pressure mechanism to impact the condensing unit with the flow of the gasified heat dissipation medium, so as to blow off the liquid attached onto the condensing unit. In this way, the present disclosure can avoid the failure of the condenser caused by too much liquid on the surface of the condensing unit, thereby increasing the heat exchange efficiency of the condenser, and at the same time, can also reduce the gas pressure and liquid boiling point inside the tank body, and increase the gas convection inside the tank body to even out the gas temperature in the tank body. Further, because the immersion cooling system of the present disclosure has the above-mentioned gas exhaust pressure mechanism, it does not need to increase the speed of the fan or the speed of the water pump in the prior art, thereby indirectly reducing energy consumption. In addition, because the immersion cooling system of the present disclosure is equipped with a recovery unit, the gasified heat dissipation medium after flowing and impacting the condensing unit can be recovered, and before the system is shut down and the cover is opened, the residual heat dissipation medium vapor can be discharged into the recovery unit to reduce the escape of residual vapor, reduce the need for non-conductive liquid replenishment and reduce costs.

DETAILED DESCRIPTIONS

The following describes the implementation of the present disclosure with examples. Those skilled in the art can easily understand other advantages and effects of the present disclosure from the contents disclosed in this specification, and can implement or apply the present disclosure via other different embodiments.

Figure 1:
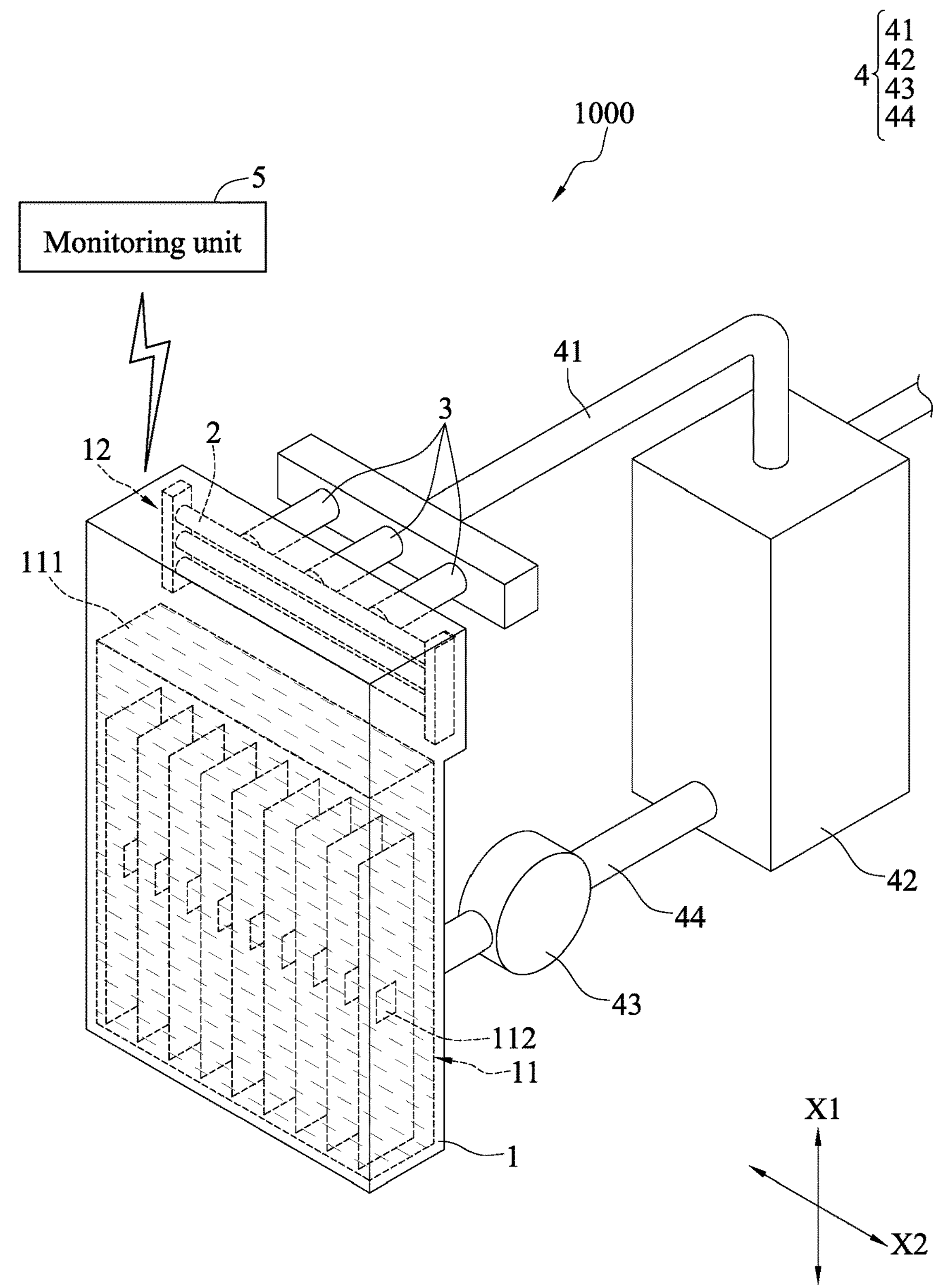
FIG. 1 is an overall schematic view of an immersion cooling system according to the present disclosure.
Figure 2:
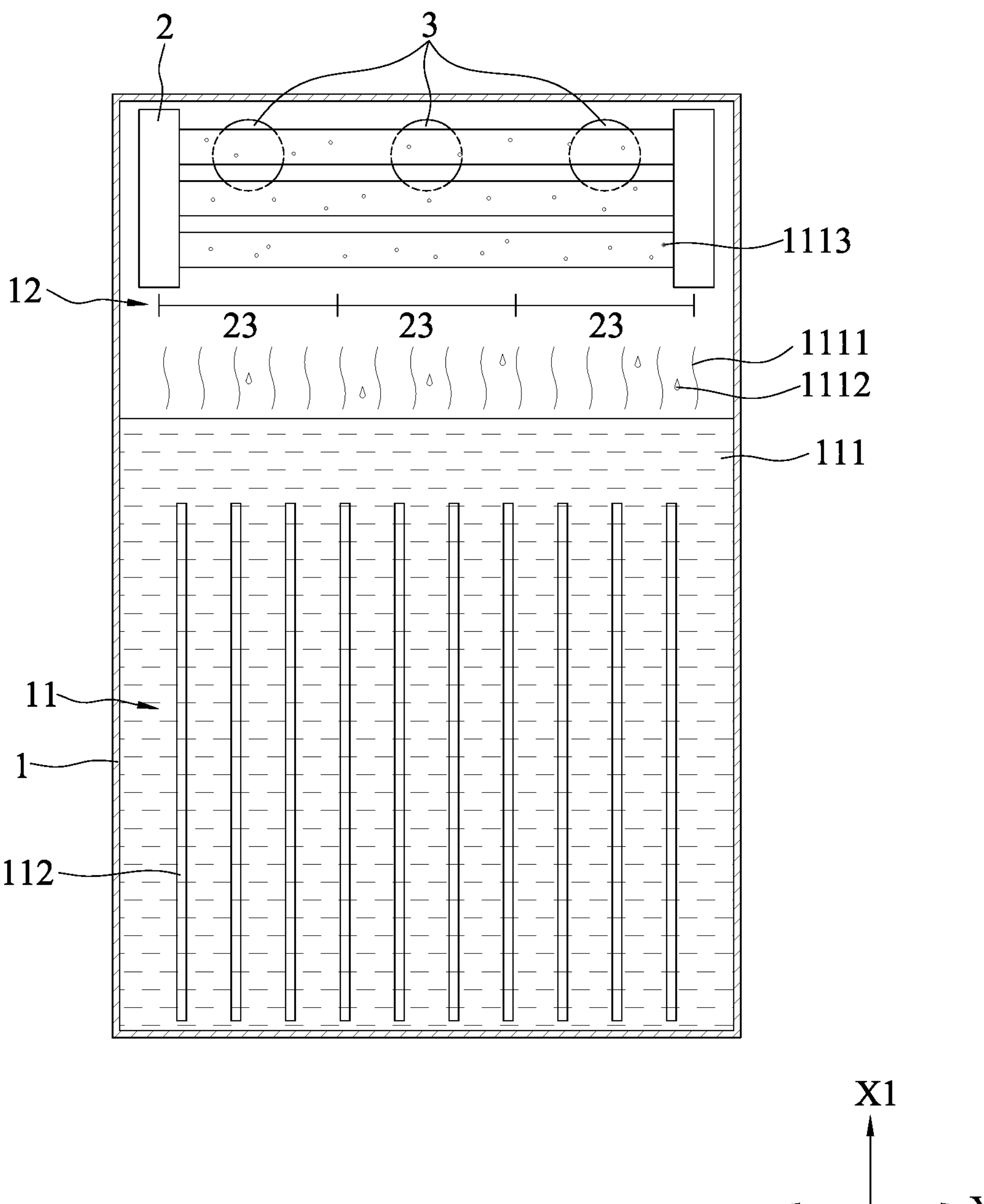
FIG. 2 is a front view of the interior of a box body in the immersion cooling system according to the present disclosure.
Figure 3:
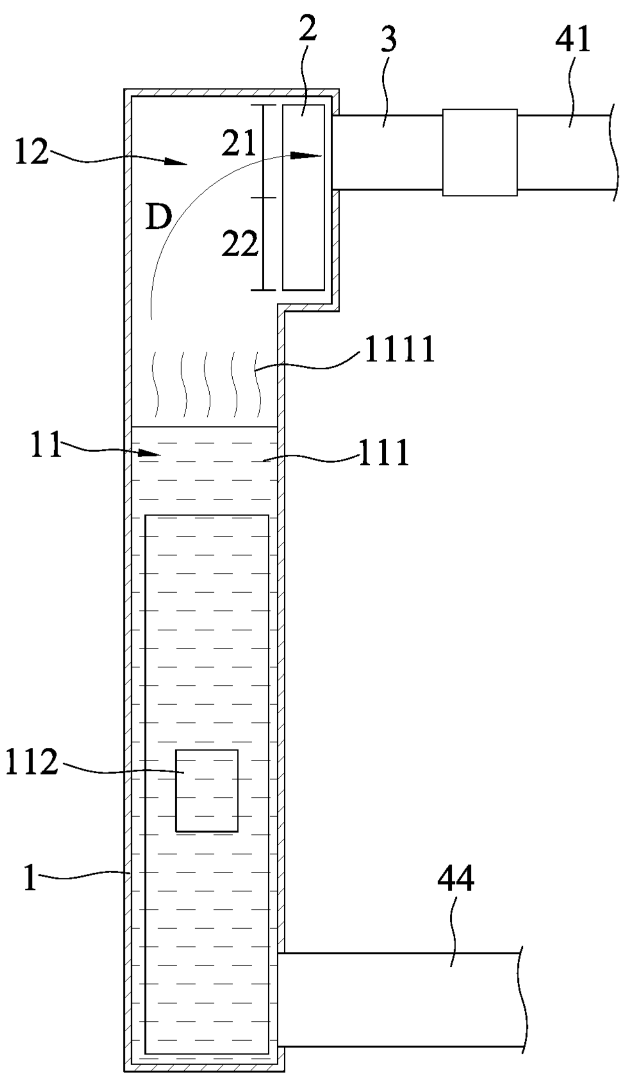
FIG. 3 is a side view of the interior of the box body in the immersion cooling system according to the present disclosure.

Please refer to FIG. 1, FIG. 2 and FIG. 3, an immersion cooling system 1000 of the present disclosure comprises a box body 1, a condensing unit 2, at least one valve unit 3, a recovery unit 4 (e.g., a recycle unit) and a monitoring unit 5. The structure of each of the elements and the connection relationship among them will be described in detail below, wherein some drawings show a first direction X1 and a second direction X2 perpendicular to each other. In addition, the quantity of the valve units 3 may be one or multiple, and the following embodiments are described with three valve units 3 as an example, but the present disclosure is not limited to as such.

The box body 1 may be a two-phase immersion cooling positive high-pressure sealed tank and has a first accommodating space 11 and a second accommodating space 12 in communication with each other and arranged up and down along the first direction X1. In an embodiment, the first direction X1 may be the direction of gravity.

The first accommodating space 11 accommodates a heat dissipation medium 111 (in liquid state), and can be configured with at least one or a plurality of heating units 112. The heat dissipation medium 111 can be, for example, a non-conductive water-cooling liquid, and each of the heating units 112 can be, for example, a pluggable main board in a server or a central processing unit, a graphics chip, other types of chips or a heat source on a circuit board, but the present disclosure is not limited to as such. The heating units 112 are all immersed in the heat dissipation medium 111, so that the heat dissipation medium 111 can absorb the heat energy generated by the heating units 112 and then gasify, and a gasified heat dissipation medium 1111 can move from the first accommodating space 11 to the second accommodating space 12.

The condensing unit 2 is disposed in the second accommodating space 12 along the first direction X1 and the second direction X2, for example, adjacent to the rear side of the box body 1. In an embodiment, the condensing unit 2 may be a condenser, such as a U-shaped condenser, a straight condenser, or a serpentine condenser, wherein both ends of the condenser can be connected to a loop-shaped pipeline, and a heat exchange device (such as a heat pipe), a water cooler (such as a fan) and a pump can be installed on the loop-shaped pipeline, and wherein the pump can drive the condenser and the water-cooling liquid in the loop-shaped pipeline. That is, after the water-cooling liquid in the condensing unit 2 exchanges heat with the gasified heat dissipation medium 1111, the heated water-cooling liquid will flow along the loop-shaped pipeline to the heat exchange device for cooling, and the pump can drive the cooled water-cooling liquid to return to the condensing unit 2 again via the loop-shaped pipeline for heat exchange in the next cycle. After heat exchange, the gasified heat dissipation medium 1111 will condense and liquefy on the copper pipe surface of the condensing unit 2 (such as a condenser), wherein a part of a liquefied heat dissipation medium 1112 may fall back to the heat dissipation medium 111 in the first accommodating space 11 by gravity, and a part of a liquefied heat dissipation medium 1113 may adhere onto the copper pipe surface of the condensing unit 2 (such as a condenser).

Figure 4:
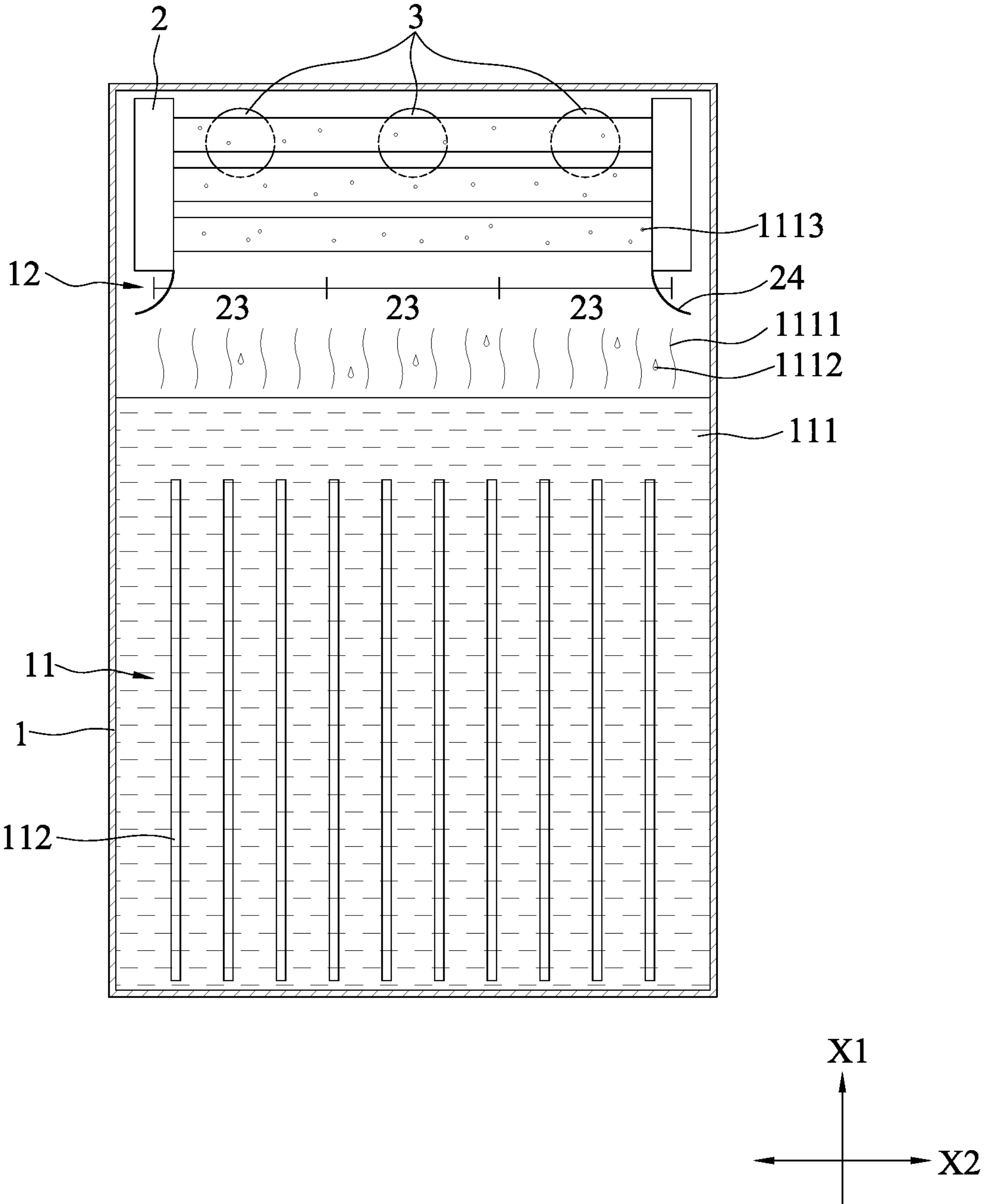
FIG. 4 is a front view of the interior of the box body in the immersion cooling system according to another embodiment of the present disclosure.

In one embodiment, the condensing unit 2 is defined with equally divided upper half portion 21 and lower half portion 22 in the first direction X1, and defined with a plurality of equally divided intervals 23 in the second direction X2, wherein the quantity of the plurality of intervals 23 corresponds to the quantity of the valve units 3, for example, all are three. In addition, in order to enable the gasified heat dissipation medium 1111 to flow through the condensing unit 2 with maximum extent, as shown in FIG. 4, two flow guiding devices 24 (such as flow guiding fins) may be provided on the bottom side of the condensing unit 2 as appropriate to guide the gasified heat dissipation medium 1111 to the condensing unit 2.

The valve units 3 are disposed on the rear side of the box body 1 at intervals along the second direction X2, and correspond to the second accommodating space 12 and the condensing unit 2. In an embodiment, each of the valve units 3 may be an electronic exhaust valve or a manual exhaust valve, but the present disclosure is not limited to as such. In addition, each of the valve units 3 corresponds to the upper half portion 21 of the condensing unit 2, and the three valve units 3 respectively correspond to midpoints of the three intervals 23 in the second direction X2, but the present disclosure is not limited to as such. In one embodiment, the distance between the valve unit 3 and the bottom side of the condensing unit 2 may be ⅔ of the total length of the condensing unit 2 in the first direction X1, but the present disclosure is not limited to as such. In another embodiment, the total opening area of the three valve units 3 is ⅙ of the total cross-sectional area formed by the condensing unit 2 in the first direction X1 and the second direction X2, but the present disclosure is not limited to as such.

The recovery unit 4 has a water outlet pipeline 41, a tank body 42, a pump 43 and a water inlet pipeline 44, wherein the water outlet pipeline 41 is in communication with the tank body 42 and the valve unit 3, the water inlet pipeline 44 is in communication with the tank body 42 and the first accommodating space 11, and the pump 43 is arranged in the water inlet pipeline 44, wherein the tank body 42 may have a heat exchange device (such as a heat pipe) and a water cooler (such as a fan), but the present disclosure is not limited to as such. When the valve units 3 are opened, the gasified heat dissipation medium 1111 enters the water outlet pipeline 41 (flow direction D) via the valve units 3, and then enters the tank body 42 to be condensed via the heat exchange device and the water cooler, wherein the condensed heat dissipation medium 111 is driven by the pump 43 and enters the first accommodating space 11 via the water inlet pipeline 44. Therefore, the recovery unit 4 of the present disclosure can effectively recover/recycle and reuse the heat dissipation medium 111. In addition, the recovery unit 4 of the present disclosure can be used not only when the system is running, but also before the system is shut down and the cover is opened, so as to discharge the gasified heat dissipation medium 1111 remaining in the second accommodating space 12 into the recovery unit 4 to reduce the escape of residual vapor when the cover is opened.

The monitoring unit 5 may be, for example, a cooling liquid monitoring host (Cooling Distribution Unit, CDU), which is used to control the valve unit 3 to open or close. For instance, the immersion cooling system 1000 of the present disclosure can be provided with a plurality of sensors (not shown), which are electrically connected to the monitoring unit 5, and the sensors can be, for example, temperature sensors, pressure sensors, flow sensors, or speed sensors, etc. The position of the sensor can be set, for example, at the two ends of the water inlet and outlet of the condensing unit 2 to obtain sensing parameters such as inlet water temperature, outlet water temperature, inlet water flow rate, outlet water flow rate, etc. The sensor can also be arranged, for example, at a place connected to the water cooler of the condensing unit 2 to obtain sensing parameters such as fan speed. The sensor can also be arranged, for example, in the first accommodating space 11 and the second accommodating space 12 to obtain sensing parameters such as the temperature (liquid state) of the heat dissipation medium 111 in the box body 1, the temperature of the gasified heat dissipation medium 1111 in the box body 1, the pressure of the gasified heat dissipation medium 1111 in the box body 1, the temperature of the heating unit 112 and the like. In this way, the monitoring unit 5 can obtain the above sensing parameters and control each of the valve units 3 to open or close according to one or more of the above sensing parameters.

The operation manner of the immersion cooling system 1000 of the present disclosure is as follows. In an embodiment, if the liquefied heat dissipation medium 1113 is attached onto the surface of the copper pipe of the condensing unit 2 (such as a condenser), the area that the gasified heat dissipation medium 1111 can contact the surface of the copper pipe of the condensing unit 2 will be reduced. This implies that the heat exchange rate is reduced, or even failure. Since the gasified heat dissipation medium 1111 cannot effectively perform heat exchange, that is, cannot condense, the gasified heat dissipation medium 1111 will continue to accumulate, so that the internal pressure of the box body 1 will increase, and the boiling point of the heat dissipation medium 111 will also increase at the same time, and the heating unit 112 will overheat. Therefore, whether the heat exchange rate of the condensing unit 2 decreases or fails can be determined by whether the internal pressure of the box body 1 (or the pressure of the gasified heat dissipation medium 1111) rises above 1 atmosphere (atm). When the internal pressure of the box body 1 rises above 1 atmosphere, each of the valve units 3 can be opened. Since the atmospheric pressure inside the box body 1 is greater than the atmospheric pressure outside the box body 1, and each of the valve units 3 corresponds to the condensing unit 2 and the second accommodating space 12, the flow direction of the gas will be from inside the box body 1 to outside the box body 1, so that the gasified heat dissipation medium 1111 at this time will quickly flow and impact the condensing unit 2 (flow direction D), so as to blow off the liquefied heat dissipation medium 1113 attached onto the condensing unit 2, and can leave the second accommodating space 12 and enter the recovery unit 4 via the valve units 3. In an embodiment, the so-called above 1 atmospheric pressure refers to 1.05 atmospheric pressure, but the present disclosure is not limited to as such, as long as the atmospheric pressure inside the box body 1 is greater than the atmospheric pressure outside the box body 1.

In other embodiments, it is possible to determine whether the heat exchange rate of the condensing unit 2 is reduced or fails by the water inlet temperature and the water outlet temperature of the condensing unit 2. For example, when the inlet water temperature is 31.4° C. and the outlet water temperature is 33.3° C. (for example, the temperature difference between the two is less than 3° C.), and the internal pressure of the box body 1 rises, it can be determined that the heat exchange rate of the condensing unit 2 is reduced or failed. At this time, the valve units 3 can be opened, so that the gasified heat dissipation medium 1111 will quickly flow and impact the condensing unit 2 to blow off the liquefied heat dissipation medium 1113 attached onto the condensing unit 2.

In yet another embodiment, the opening timing of each of the valve units 3 may also be determined via conditions such as the increase degree of the internal pressure of the box body 1 (for example, an increase of 0.2 bar), the flow rate of the water in and out of the condensing unit 2, the fan speed, the temperature (liquid state) rise degree of the heat dissipation medium 111 in the box body 1, the temperature of the gasified heat dissipation medium 1111 in the box body 1 or the temperature of the heating unit 112 (for example, exceeding the predetermined threshold), and the like. For instance, when the temperature (liquid state) of the heat dissipation medium 111 in the box body 1 is 5° C. higher than the boiling point of the original specification, the valve units 3 can be decided to be opened; when the temperature of the gasified heat dissipation medium 1111 in the box body 1 is 10° C. higher than the vapor temperature of the original specification, the valve units 3 can be decided to be opened; when the temperature of the heating unit 112 is within 5° C. of the permissible specification temperature of the element, and the flow rate of the water in and out of the condensing unit 2 and the fan speed are not increased, the valve units 3 can be decided to be opened.

The verification results of the immersion cooling system 1000 of the present disclosure are as follows. When the condensing unit 2 fails, the air pressure in the tank body 42 increases by 0.2 bar, and the heat-dissipating capacity is calculated to be only 659 W. After implementing the above-mentioned gasified heat dissipation medium 1111 of the present disclosure to quickly flow and impact the condensing unit 2 to blow off the liquefied heat dissipation medium 1113 attached onto the condensing unit 2, the air pressure in the tank body 42 is reduced to 0 bar, and the heat-dissipating capacity is calculated to be 1565 W. This fully proves that the present disclosure can indeed repair the problem that the heat exchange rate decreases or fails due to excessive liquid adhesion on the surface of the condensing unit 2.

To sum up, the immersion cooling system of the present disclosure utilizes the gas exhaust pressure mechanism to impact the condensing unit with the flow of the gasified heat dissipation medium, so as to blow off the liquid attached onto the condensing unit. In this way, the present disclosure can avoid the failure of the condenser caused by too much liquid on the surface of the condensing unit, thereby increasing the heat exchange efficiency of the condenser, and at the same time, can also reduce the gas pressure and liquid boiling point inside the tank body, and increase the gas convection inside the tank body to even out the gas temperature in the tank body. Further, because the immersion cooling system of the present disclosure has the above-mentioned gas exhaust pressure mechanism, it does not need to increase the speed of the fan or the speed of the water pump in the prior art, thereby reducing energy consumption. In addition, because the immersion cooling system of the present disclosure is equipped with a recovery unit, the gasified heat dissipation medium after flowing and impacting the condensing unit can be recovered, and before the system is shut down and the cover is opened, the residual heat dissipation medium vapor can be discharged into the recovery unit to reduce the escape of residual vapor, reduce the need for non-conductive liquid replenishment and reduce costs.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An immersion cooling system, comprising:

a box body having a first accommodating space and a second accommodating space arranged along a first direction, wherein the first accommodating space accommodates a heat dissipation medium and at least one heating chip immersed in the heat dissipation medium, wherein the heat dissipation medium is gasified after absorbing a heat energy of the heating chip, and the gasified heat dissipation medium moves from the first accommodating space to the second accommodating space;

a condenser arranged in the second accommodating space along the first direction and a second direction perpendicular to the first direction, wherein the condenser is used to enable the gasified heat dissipation medium to undergo heat exchange, condensation and liquefaction, wherein the condenser is defined with an upper half portion and a lower half portion in the first direction; and at least one valve disposed on the box body along the second direction, corresponding to the second accommodating space, and aligned with the upper half portion of the condenser along a third direction perpendicular to the first direction and the second direction, wherein the gasified heat dissipation medium flows and impacts the condenser along the third direction to blow off the liquefied heat dissipation medium attached onto the condenser when the valve is opened.

2. The immersion cooling system of claim 1, wherein the valve is opened when an internal pressure of the box body rises above 1 atmosphere.

3. The immersion cooling system of claim 1, wherein a quantity of the valves is plural, the condenser is defined with a plurality of intervals in the second direction, and a quantity of the plurality of intervals corresponds to the quantity of the plurality of valves.

4. The immersion cooling system of claim 3, wherein the plurality of valves are respectively located at midpoints of the plurality of intervals of the condenser in the second direction.

5. The immersion cooling system of claim 1, wherein a distance between the valve and a bottom side of the condenser is ⅔ of a total length of the condenser in the first direction.

6. The immersion cooling system of claim 1, wherein a total opening area of the valve is ⅙ of a total cross-sectional area formed by the condenser—in the first direction and the second direction.

7. The immersion cooling system of claim 1, wherein the first direction is a direction of gravity.

8. The immersion cooling system of claim 1, wherein the condenser is a U-shaped condenser, a straight condenser, or a serpentine condenser.

9. The immersion cooling system of claim 1, further comprising a recovery unit, wherein the recovery unit has a water outlet pipeline, a tank body, a pump and a water inlet pipeline, wherein the water outlet pipeline is in communication with the tank body and the valve, the water inlet pipeline is in communication with the tank body and the first accommodating space, and the pump is arranged in the water inlet pipeline, wherein when the valve is opened, the gasified heat dissipation medium enters the water outlet pipeline via the valve, and then enters the tank body to be condensed, wherein the condensed heat dissipation medium is driven by the pump and enters the first accommodating space via the water inlet pipeline.

10. The immersion cooling system of claim 1, further comprising a monitoring host for controlling the valve to open or close according to one or more of a plurality of sensing parameters obtained by the monitoring host.

11. The immersion cooling system of claim 10, wherein the plurality of sensing parameters include an inlet water temperature of the condenser, an outlet water temperature of the condenser, an inlet water flow rate of the condenser, an outlet water flow rate of the condenser, a fan speed of the condenser, a temperature of the heat dissipation medium in the box body, a temperature of the gasified heat dissipation medium in the box body, a pressure of the gasified heat dissipation medium in the box body and a temperature of the heating chip.

* * * * *